(12) United States Patent
Ichijyo et al.

(10) Patent No.: US 11,973,432 B2
(45) Date of Patent: Apr. 30, 2024

(54) POWER CONVERSION APPARATUS

(71) Applicant: DENSO CORPORATION, Kariya (JP)

(72) Inventors: Hiromi Ichijyo, Kariya (JP); Yuu Yamahira, Kariya (JP); Kazuya Takeuchi, Kariya (JP); Masanori Sakata, Kariya (JP); Masayoshi Nishihata, Kariya (JP)

(73) Assignee: DENSO CORPORATION, Kariya (JP)

( * ) Notice: Subject to any disclaimer, the term of this patent is extended or adjusted under 35 U.S.C. 154(b) by 247 days.

(21) Appl. No.: 17/690,141

(22) Filed: Mar. 9, 2022

(65) Prior Publication Data

US 2022/0200470 A1 Jun. 23, 2022

Related U.S. Application Data

(63) Continuation of application No. PCT/JP2020/031964, filed on Aug. 25, 2020.

(30) Foreign Application Priority Data

Sep. 10, 2019 (JP) ................ 2019-164857

(51) Int. Cl.
*H02M 7/00* (2006.01)
*H01L 23/31* (2006.01)
(Continued)

(52) U.S. Cl.
CPC ........ *H02M 7/003* (2013.01); *H01L 23/3107* (2013.01); *H01L 23/5286* (2013.01);
(Continued)

(58) Field of Classification Search
CPC . H02M 7/003; H02M 7/5387; H01L 23/3107; H01L 23/5286; H01L 25/18
See application file for complete search history.

(56) References Cited

U.S. PATENT DOCUMENTS 9,271,420 B1 * 2/2016 Hsiao ............... H05K 7/026
2009/0294195 A1 * 12/2009 Otsuka ............. H05K 7/1432
180/65.21

(Continued)

FOREIGN PATENT DOCUMENTS

JP 2013-021029 A 1/2013
JP 2017-099140 A 6/2017

OTHER PUBLICATIONS

U.S. Appl. No. 17/690,170, filed Mar. 9, 2022, in the name of Ichijyo et al.

*Primary Examiner* — Jue Zhang
(74) *Attorney, Agent, or Firm* — Oliff PLC

(57) ABSTRACT

First switches include first electrodes, which are mutually connected with each other via a first internal bus bar, and second electrodes, which are mutually connected with each other via a second internal bus bar. A first resin member encapsulates the first switches and the first and second internal bus bars. Second switches include third electrodes, which are mutually connected with each other via a third internal bus bar, and fourth electrodes, which are mutually connected with each other via a fourth internal bus bar. A second resin member that encapsulates the second switches and the third and fourth internal bus bars. The second module is arranged alongside with the first module. The second internal bus bar and the third internal bus bar are partially exposed from the first resin member and the second resin member, respectively, and are directly joined with each other.

3 Claims, 12 Drawing Sheets

(51) Int. Cl.
*H01L 23/528* (2006.01)
*H01L 25/18* (2023.01)
*H02M 7/5387* (2007.01)
*H02P 27/06* (2006.01)

(52) U.S. Cl.
CPC .......... *H01L 25/18* (2013.01); *H02M 7/5387* (2013.01); *H02P 27/06* (2013.01)

(56) References Cited

U.S. PATENT DOCUMENTS

2015/0214205 A1* 7/2015 Tokuyama .......... H01L 29/7393
257/139
2016/0247793 A1 8/2016 Ohno
2020/0321319 A1 10/2020 Matsuoka et al.
2021/0167003 A1* 6/2021 Ieiri ................. H01L 23/49861

* cited by examiner

POWER CONVERSION APPARATUS

CROSS REFERENCE TO RELATED APPLICATION

The present application is a continuation application of International Patent Application No. PCT/JP2020/031964 filed on Aug. 25, 2020, which designated the U.S. and claims the benefit of priority from Japanese Patent Application No. 2019-164857 filed on Sep. 10, 2019. The entire disclosures of all of the above applications are incorporated herein by reference.

TECHNICAL FIELD

The present disclosure relates to a power conversion apparatus.

BACKGROUND

Conventionally, a semiconductor module composed of layered semiconductor devices is known.

SUMMARY

According to a first aspect of the present disclosure, a power conversion apparatus includes a first module and a second module. The first module includes multiple first switches each including a first electrode and a second electrode; a first internal bus bar mutually connecting the first electrodes; a second internal bus bar mutually connecting the second electrodes; and a first resin member that encapsulates the first switches, the first internal bus bar, and the second internal bus bar. The second module includes multiple second switches each including a third electrode and a fourth electrode; a third internal bus bar mutually connecting the third electrodes; a fourth internal bus bar mutually connecting the fourth electrodes; a second resin member that encapsulates the second switches, the third internal bus bar, and the fourth internal bus bar.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
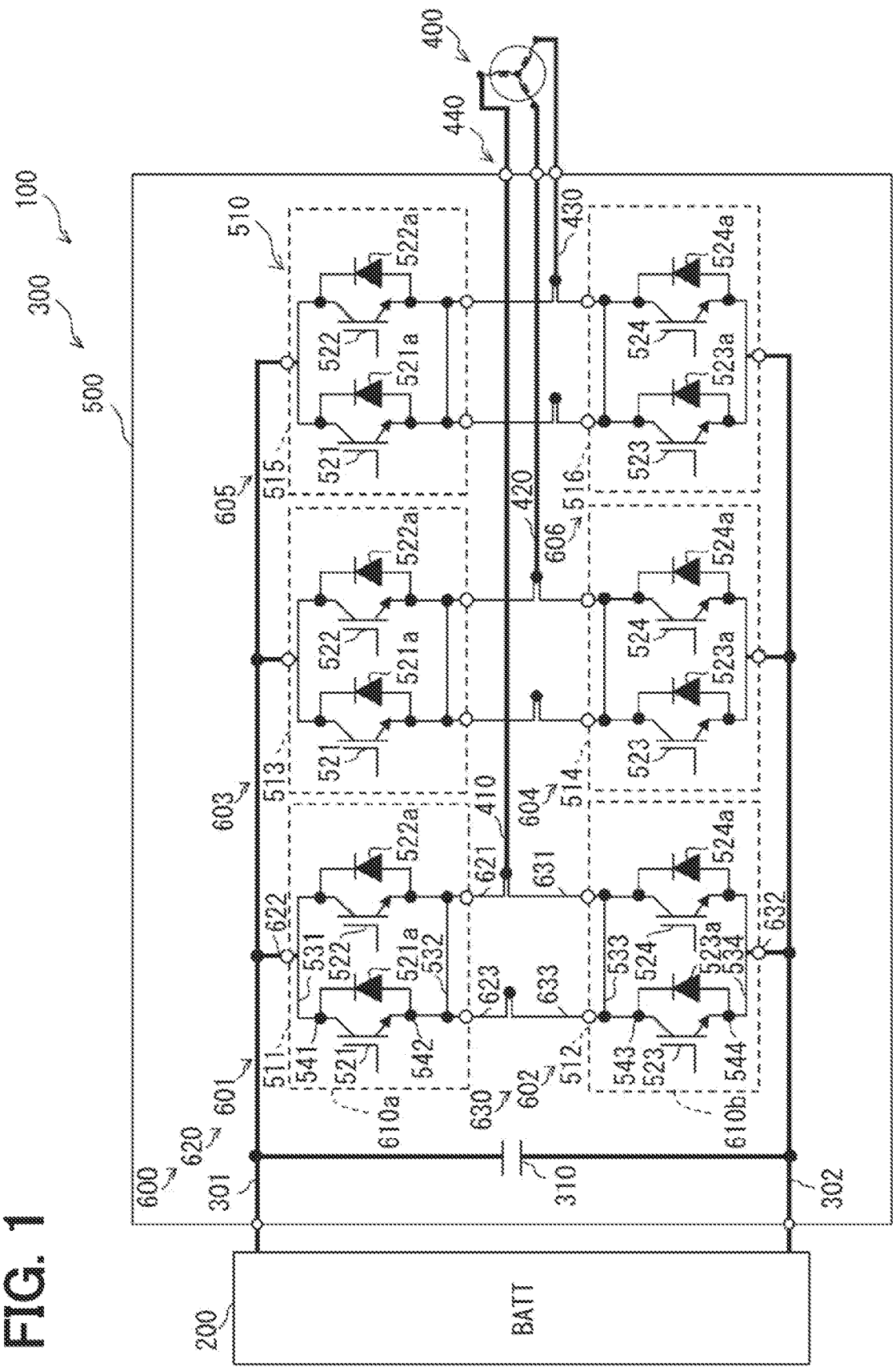
FIG. 1 is a circuit diagram illustrating an in-vehicle system.

The description below explains examples of the present application.

According to an example of the present application, multiple semiconductor devices are layered to configure a semiconductor module. Each of the semiconductor devices includes a semiconductor chip, an encapsulation resin to seal the semiconductor chip, and an output terminal that is connected to the semiconductor chip inside the encapsulation resin and protrudes from the inside of the encapsulation resin to the outside.

Multiple semiconductor devices are arranged in a row in the layering direction. An output terminal is provided for each of the semiconductor devices. The output terminals are arranged in a row along the layering direction.

The output terminals of the semiconductor module according to this example are arranged in the layering direction. In terms of two semiconductor devices adjacently arranged in the layering direction, an output terminal of one semiconductor device and an output terminal of the other semiconductor device are connected via output wiring. Therefore, the output wiring may increase inductance components between the two semiconductor devices.

A power conversion apparatus according to an example of the present disclosure includes a first module and a second module. The first module includes multiple first switches each including a first electrode and a second electrode; a first internal bus bar mutually connecting the first electrodes; a second internal bus bar mutually connecting the second electrodes; and a first resin member that encapsulates the first switches, the first internal bus bar, and the second internal bus bar. The second module includes multiple second switches each including a third electrode and a fourth electrode; a third internal bus bar mutually connecting the third electrodes; a fourth internal bus bar mutually connecting the fourth electrodes; a second resin member that encapsulates the second switches, the third internal bus bar, and the fourth internal bus bar. The first module and the second module are arranged alongside. The second internal bus bar is partially exposed from the first resin member to extend in an orthogonal direction orthogonal to an arrangement direction in which the first module and the second module are arranged. The third internal bus bar is partially exposed from the second resin member to extend in the orthogonal direction. At least one of the second internal bus bar and the third internal bus bar extends toward the other to directly join the second internal bus bar and the third internal bus bar.

According to the present disclosure, the second internal bus bar exposed from the first resin member of the first module is directly joined to the third internal bus bar exposed from the second resin member of the second module. Therefore, the configuration enables to easily inhibit an increase in inductance components between the first module and the second module compared to a configuration where the second internal bus bar and the third internal bus bar are indirectly joined via an inclusion such as a conductive member.

The description below explains embodiments for carrying out the present disclosure by reference to the drawings. The same reference numerals are given to parts in each embodiment similar to those described in the preceding embodiment and a redundant description may be omitted for simplicity. If only a part of a configuration in each embodiment is described, other parts in the configuration may conform to those described in the preceding embodiment. Each embodiment may contain parts that are explicitly described to be capable of combination. In addition, the embodiments can be partially combined, if possible, even if the partial combination is not explicitly described to be possible.

First Embodiment

The description below first explains an in-vehicle system 100 provided with a power conversion apparatus 300 based on FIG. 1. The in-vehicle system 100 configures a system for electric vehicles. The in-vehicle system 100 includes a battery 200, a power conversion apparatus 300, and a motor 400.

The in-vehicle system 100 includes multiple ECUs (unshown). The ECUs mutually transmit and receive signals via the bus wiring. The ECUs cooperatively control an electric vehicle. The ECUs control the regeneration and driving of the motor 400 according to SOC of the battery 200. SOC stands for a state of charge. ECU stands for an electronic control unit.

The battery 200 includes multiple secondary batteries. The secondary batteries configure a series-connected battery stack. The SOC of the battery stack corresponds to the SOC of the battery 200. The secondary battery is available as a lithium-ion secondary battery, a nickel-hydrogen secondary battery, or an organic radical battery, for example.

The power conversion apparatus 300 includes an inverter 500. As the inverter 500, the power conversion apparatus 300 performs power conversion between the battery 200 and the motor 400. The power conversion apparatus 300 converts the DC power of the battery 200 into AC power. The power conversion apparatus 300 converts the AC power generated by the power generation (regeneration) of the motor 400 into DC power.

The motor 400 is connected to an output shaft (unshown) of the electric vehicle. The rotational energy of the motor 400 is transmitted to a traveling wheel of the electric vehicle via the output shaft. The rotational energy of the traveling wheel is transmitted to the motor 400 via the output shaft.

The motor 400 is driven by AC power supplied from the power conversion apparatus 300. A driving force is thus given to the traveling wheels. The motor 400 is regenerated by the rotational energy transmitted from the traveling wheels. The power conversion apparatus 300 converts the regenerated AC power into DC power. The DC power is supplied to the battery 200. The DC power is also supplied to various electric loads mounted on the electric vehicle.

Inverter

The inverter 500 includes a capacitor 310 and a switch group 510. The battery 200 connects with a first power supply bus bar 301 and a second power supply bus bar 302. A capacitor 310 and the switch group 510 are connected in parallel between the first power supply bus bar 301 and the second power supply bus bar 302. The switch group 510 and the motor 400 are connected via an output bus bar 440.

When the motor 400 is driven, a control signal from the ECU provides PWM control for a high-side switch and a low-side switch included in the switch group 510. The inverter 500 then generates a three-phase alternating current. When the motor 400 generates (regenerates) power, the ECU stops the output of control signals, for example. The AC power generated by the motor 400 passes through a diode included in the three-phase switch group 510. As a result, the AC power is converted into DC power.

The present embodiment uses an n-channel type IGBT as switches included in the switch group 510. Instead of IGBTs, MOSFETs can be used as switches. The diode is optional when MOSFETs are used as the switches.

These switches can be manufactured through the use of semiconductors such as Si and wide-gap semiconductors such as SiC. No limitations are placed on constituent materials for the semiconductor devices.

The switch group 510 includes a U-phase high-side switch 511, a U-phase low-side switch 512, a V-phase high-side switch 513, a V-phase low-side switch 514, a W-phase high-side switch 515, and a W-phase low-side switch 516. Each of these switches includes two parallel-connected switches.

The U-phase high-side switch 511, the V-phase high-side switch 513, and the W-phase high-side switch 515 each include a first high-side switch 521 and a second high-side switch 522 as switches. The U-phase high-side switch 511, the V-phase high-side switch 513, and the W-phase high-side switch 515 each include a first high-side diode 521a and a second high-side diode 522a.

The cathode electrode of the first high-side diode 521a is connected to a first collector electrode 541 as the collector electrode of the first high-side switch 521. The anode electrode of the first high-side diode 521a is connected to a first emitter electrode 542 as the emitter electrode of the first high-side switch 521. Consequently, the first high-side diode 521a is connected to the first high-side switch 521 in an antiparallel manner.

The cathode electrode of the second high-side diode 522a is connected to the first collector electrode 541 of the second high-side switch 522. The anode electrode of the second high-side diode 522a is connected to the first emitter electrode 542 of the second high-side switch 522. Consequently, the second high-side diode 522a is connected to the second high-side switch 522 in an antiparallel manner. The first high-side switch 521 and the second high-side switch 522 are comparable to a first switch. The first collector electrode 541 is comparable to a first electrode. The first emitter electrode 542 is comparable to a second electrode.

The U-phase low-side switch 512, the V-phase low-side switch 514, and the W-phase low-side switch 516 each include a first low-side switch 523 and a second low-side switch 524 as switches. The U-phase low-side switch 512, the V-phase low-side switch 514, and the W-phase low-side switch 516 each include a first low-side diode 523a and a second low-side diode 524a.

The cathode electrode of the first low-side diode 523a is connected to a second collector electrode 543 as the collector electrode of the first low-side switch 523. The anode electrode of the first low-side diode 523a is connected to a second emitter electrode 544 as the emitter electrode of the first low-side switch 523. Consequently, the first low-side diode 523a is connected to the first low-side switch 523 in an antiparallel manner.

The cathode electrode of the second low-side diode 524a is connected to the second collector electrode 543 of the second low-side switch 524. The anode electrode of the second low-side diode 524a is connected to the second emitter electrode 544 of the second low-side switch 524. Consequently, the second low-side diode 524a is connected to the second low-side switch 524 in an antiparallel manner. The first low-side switch 523 and the second low-side switch 524 are comparable to a second switch. The second collector electrode 543 is comparable to a third electrode. The second emitter electrode 544 is comparable to a fourth electrode.

First Module

The first high-side switch 521, the first high-side diode 521a, the second high-side switch 522, and the second high-side diode 522a are encapsulated with a first resin member 610a to form a first module 620 as a switch module 600.

The first collector electrode 541 of the first high-side switch 521 and the first collector electrode 541 of the second high-side switch 522 are connected in the first resin member 610a of the first module 620 via a first internal bus bar 531. The first emitter electrode 542 of the first high-side switch 521 and the first emitter electrode 542 of the second high-side switch 522 are connected via a second internal bus bar 532. The first high-side switch 521 and the second high-side switch 522 are connected in parallel in the first resin member 610a via the first internal bus bar 531 and the second internal bus bar 532.

The first internal bus bar 531 and the second internal bus bar 532 are partially exposed from the first resin member 610a of the first module 620. A part of the first internal bus bar 531 exposed from the first resin member 610a is used as a first main terminal 622 and is connected to the first power supply bus bar 301. The second internal bus bar 532 is partially exposed from the first resin member 610a and is used as a first output terminal 621 and a first connection terminal 623.

Second Module

The first low-side switch 523, the first low-side diode 523a, the second low-side switch 524, and the second low-side diode 524a are encapsulated with a second resin member 610b to configure a second module 630 as the switch module 600.

The second collector electrode 543 of the first low-side switch 523 and the second collector electrode 543 of the second low-side switch 524 are connected in the second resin member 610b of the second module 630 via a third internal bus bar 533. The second emitter electrode 544 of the first low-side switch 523 and the second emitter electrode 544 of the second low-side switch 524 are connected via a fourth internal bus bar 534. The first low-side switch 523 and the second low-side switch 524 are connected in parallel in the second resin member 610b via the third internal bus bar 533 and the fourth internal bus bar 534.

The third internal bus bar 533 and the fourth internal bus bar 534 are partially exposed from the second resin member 610b of the second module 630. The third internal bus bar 533 is partially exposed from the second resin member 610b and is used as a second output terminal 631 and a second connection terminal 633. A part of the fourth internal bus bar 534 exposed from the second resin member 610b is used as a second main terminal 632 and is connected to the second power supply bus bar 302.

First Module and Second Module

As above, the first output terminal 621, the first main terminal 622, and the first connection terminal 623 are exposed from the first resin member 610a of the first module 620. The second output terminal 631, the second main terminal 632, and the second connection terminal 633 are exposed from the second resin member 610b of the second module 630.

As illustrated in FIG. 1, the first output terminal 621 and the second output terminal 631 are connected. The first connection terminal 623 and the second connection terminal 633 are connected. The first main terminal 622 is connected to the first power supply bus bar 301. The second main terminal 632 is connected to the second power supply bus bar 302. Consequently, the first module 620 and the second module 630 are connected in series between the first power supply bus bar 301 and the second power supply bus bar 302.

The first power supply bus bar 301 is connected to one electrode of the capacitor 310. The second power supply bus bar 302 is connected to the other electrode of the capacitor 310. Consequently, a closed loop is formed among the capacitor 310, the first module 620, and the second module 630.

The output bus bar 440 is connected to the first output terminal 621. The first output terminal 621 is connected to a stator coil of the motor 400 via the output bus bar 440. The output bus bar 440 may be connected to the second output terminal 631.

In the following description, the first module 620 including the U-phase high-side switch 511 is denoted as a first U-phase module 601. The first module 620 including the V-phase high-side switch 513 is denoted as a first V-phase module 603. The first module 620 including the W-phase high-side switch 515 is denoted as a first W-phase module 605.

The second module 630 including the U-phase low-side switch 512 is denoted as a second U-phase module 602. The second module 630 including the V-phase low-side switch 514 is denoted as a second V-phase module 604. The second module 630 including the W-phase low-side switch 516 is denoted as a second W-phase module 606.

The output bus bar 440 connected to a U-phase stator coil is denoted as a U-phase bus bar 410. The output bus bar 440 connected to a V-phase stator coil is denoted as a V-phase bus bar 420. The output bus bar 440 connected to a W-phase stator coil is denoted as a W-phase bus bar 430.

The first output terminal 621 of the first U-phase module 601 is connected to the U-phase stator coil of the motor 400 via the U-phase bus bar 410.

The first output terminal 621 of the first V-phase module 603 is connected to the V-phase stator coil of the motor 400 via the V-phase bus bar 420.

The first output terminal 621 of the first W-phase module 605 is connected to the W-phase stator coil of the motor 400 via the W-phase bus bar 430.

Configuration of the Power Conversion Apparatus

The configuration of the power conversion apparatus 300 will be described below. The following assumes three directions such as x, y, and z directions that are orthogonal to each other. The x-direction corresponds to an arrangement direction. The y-direction corresponds to a horizontal direction. The z-direction corresponds to an orthogonal direction. The description of "direction" is omitted from the drawings. The battery 200 is abbreviated as "BATT" in the drawings.

The power conversion apparatus 300 includes a cooler 640, a capacitor case 700, and a case 800 in addition to the circuit components described so far.

As above, the inverter 500 includes multiple switch modules 600. The cooler 640 stores and cools the switch modules 600. The switch modules 600 are stored in the cooler 640 to configure a power module 900.

The capacitor case 700 stores the capacitor 310. Further, the capacitor case 700 supports the first power supply bus bar 301 and the second power supply bus bar 302.

The case 800 stores the capacitor case 700 and the power module 900.

Figure 2:
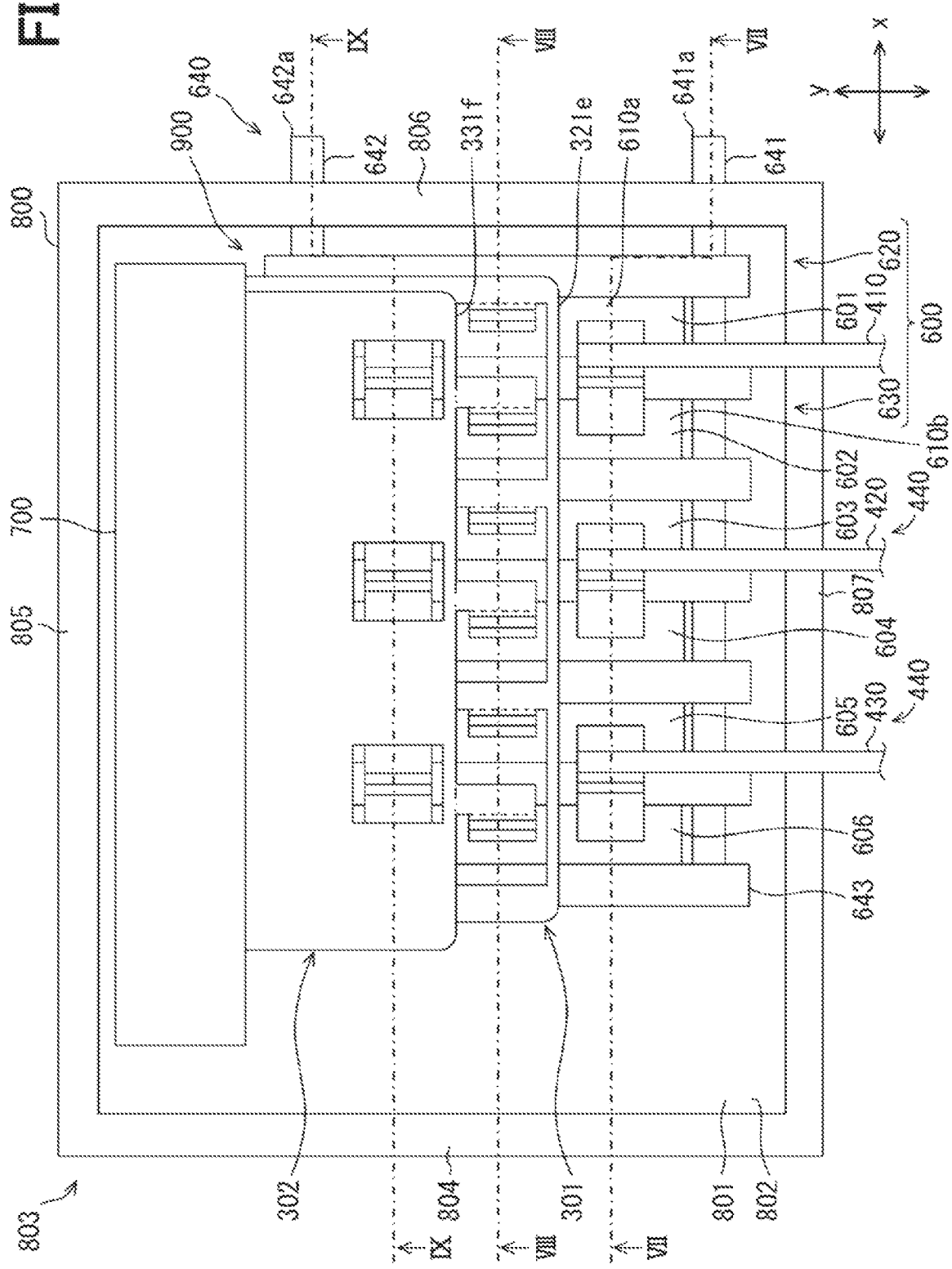
FIG. 2 is a plan view illustrating mode of storing a power module in a case.

As illustrated in FIG. 2, the case 800 has a bottom portion 801 and a side portion 803. The bottom portion 801 is thin in the z-direction. The side portion 803 annularly rises in the z-direction from edges of an inner bottom surface 802 of the bottom portion 801. The side portion 803 has a first sidewall 804, a second sidewall 805, a third sidewall 806, and a fourth sidewall 807. The first sidewall 804 separately faces the third sidewall 806 in the x-direction. The second sidewall 805 separately faces the fourth sidewall 807 in the y-direction. The first sidewall 804, the second sidewall 805, the third sidewall 806, and the fourth sidewall 807 are annularly connected in the z-direction in a circumferential direction. The capacitor case 700 and the power module 900 are stored in a storage space partitioned by the bottom portion 801 and the side portion 803.

Power Module

The power module 900 includes the switch modules 600 and the cooler 640. As illustrated in FIGS. 3 through 12, a resin member of the switch module 600 is shaped to be thin in the x-direction. The resin member is a generic name for the first resin member 610*a* and the second resin member 610*b*. The resin member includes a first principal surface 611, a second principal surface 612, a first side surface 613, a second side surface 614, a top surface 615, and a bottom surface 616. The first principal surface 611 and the second principal surface 612 are separately arranged in the x-direction. The first side surface 613 and the second side surface 614 are separately arranged in the y-direction. The top surface 615 and the bottom surface 616 are separately arranged in the z-direction.

Figure 3:
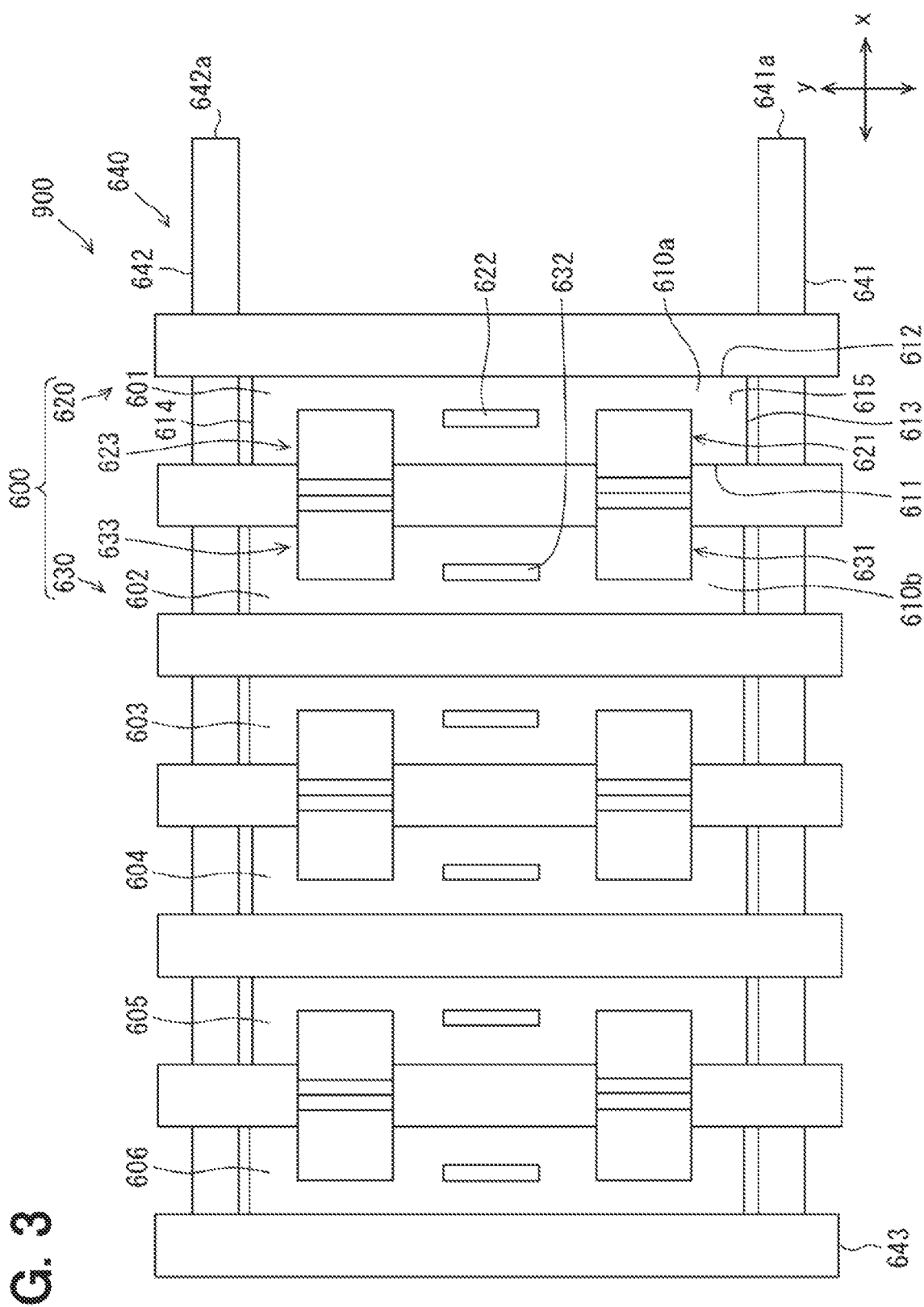
FIG. 3 is a plan view illustrating the power module.

As illustrated in FIG. 3, the tips of the first output terminal 621, the first main terminal 622, and the first connection terminal 623 are exposed from the top surface 615 of the first module 620. The first output terminal 621, the first main terminal 622, and the first connection terminal 623 are arranged in order in the y-direction from the first side surface 613 to the second side surface 614.

The tips of the second output terminal 631, the second main terminal 632, and the second connection terminal 633 are exposed from the top surface 615 of the second module 630. The second output terminal 631, the second main terminal 632, and the second connection terminal 633 are arranged in order in the y-direction from the first side surface 613 to the second side surface 614.

As illustrated in FIGS. 2 through 6, the cooler 640 includes a supply pipe 641, a discharge pipe 642, and multiple relay pipes 643. The supply pipe 641 and discharge pipe 642 are connected via multiple relay pipes 643. Refrigerant is supplied to the supply pipe 641. The refrigerant flows from the supply pipe 641 to the discharge pipe 642 via the relay pipes 643. The refrigerant is supplied to a supply port 641*a* from the outside of the supply pipe 641. A discharge port 642*a* discharges the refrigerant supplied from the relay pipe 643 to the outside of the discharge pipe 642. The supply port 641*a* and the discharge port 642*a* are separately arranged in the y-direction.

The supply pipe 641 and the discharge pipe 642 extend in the x-direction. The supply pipe 641 and the discharge pipe 642 are separated in the y-direction. Each of the relay pipes 643 extends in the y-direction from the supply pipe 641 to the discharge pipe 642. The relay pipes 643 are separately arranged in the x-direction. A gap is formed between two adjacent relay pipes 643. The cooler 640 includes a total of six gaps. Each of the first U-phase module 601 through the second W-phase module 606 is arranged in each of the six gaps. The power module 900 is thus configured.

As illustrated in FIG. 3, each of the switch modules 600 is placed in the gap so that the second principal surface 612 is located toward the supply port 641*a* and the discharge port 642*a*. Each of the switch modules 600 is placed in the gap so that the first side surface 613 is located toward the supply pipe 641 and the second side surface 614 is located toward the discharge pipe 642.

The first output terminal 621, the first main terminal 622, and the first connection terminal 623 exposed from the first module 620 are arranged in order from the supply pipe 641 to the discharge pipe 642. The second output terminal 631, the second main terminal 632, and the second connection terminal 633 exposed from the second module 630 are arranged in order from the supply pipe 641 to the discharge pipe 642.

The principal surface of each of the six switch modules 600 touches the relay pipe 643. The force given from an unshown spring increases a contact area between the switch module 600 and the relay pipe 643. This makes it possible to dissipate the heat generated from the six switch modules 600 to the refrigerant via the relay pipe 643.

The first U-phase module 601, the second U-phase module 602, the first V-phase module 603, the second V-phase module 604, the first W-phase module 605, and the second W-phase module 606 are arranged in this order to separate from the supply port 641*a* and the discharge port 642*a*.

Output Terminals

Figure 7:
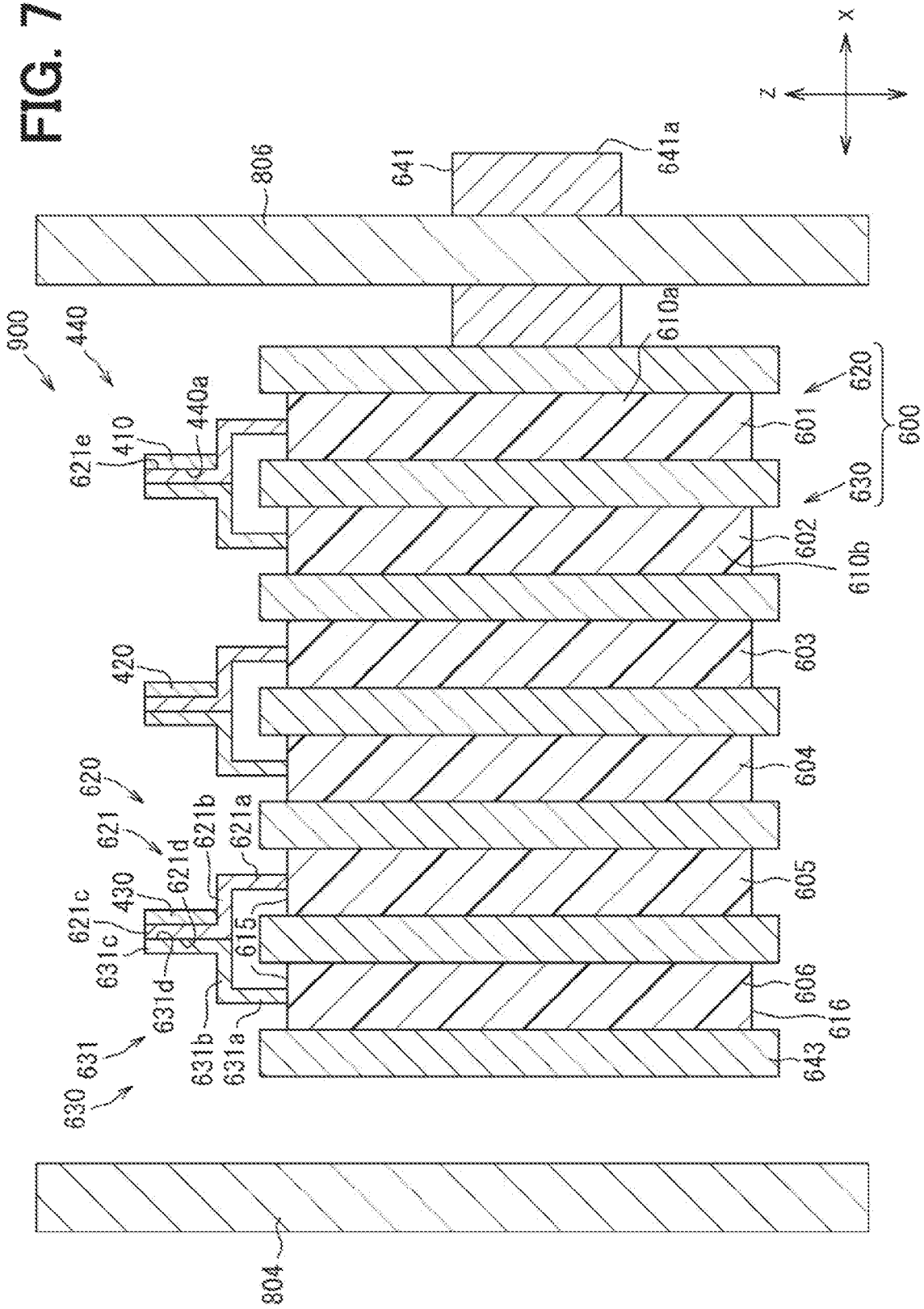
FIG. 7 is a sectional view of the power module taken along the line VII-VII of FIG. 2.

As illustrated in FIG. 7, the first output terminal 621 includes a first base portion 621*a*, a first relay portion 621*b*, and a first extension portion 621*c*. The first base portion 621*a* protrudes and extends from the first resin member 610*a* in the z-direction to separate from the top surface 615. The first relay portion 621*b* extends from the end of the first base portion 621*a* in the x-direction to separate from the supply port 641*a* and the discharge port 642*a*. The first extension portion 621*c* extends from the end of the first relay portion 621*b* in the z-direction to separate from the top surface 615.

The second output terminal 631 includes a second base portion 631*a*, a second relay portion 631*b*, and a second extension portion 631*c*. The second base portion 631*a* protrudes and extends from the second resin member 610*b* in the z-direction to separate from the top surface 615. The second relay portion 631*b* extends from the end of the second base portion 631*a* in the x-direction toward the supply port 641*a* and the discharge port 642*a*. The second extension portion 631*c* extends from the end of the second relay portion 631*b* in the z-direction to separate from the top surface 615.

The first base portion 621*a* separately faces the second base portion 631*a* in the x-direction. A first end face 621*d* separates from the supply port 641*a* and the discharge port 642*a* of the first extension portion 621*c* in the x-direction. The first end face 621*d* closely faces a second end face 631*d* toward the supply port 641*a* and the discharge port 642*a* of the second extension portion 631*c* in the x-direction. The first end face 621*d* and the second end face 631*d* are joined by laser welding, for example. Consequently, the first output terminal 621 and the second output terminal 631 are directly joined.

Figure 4:
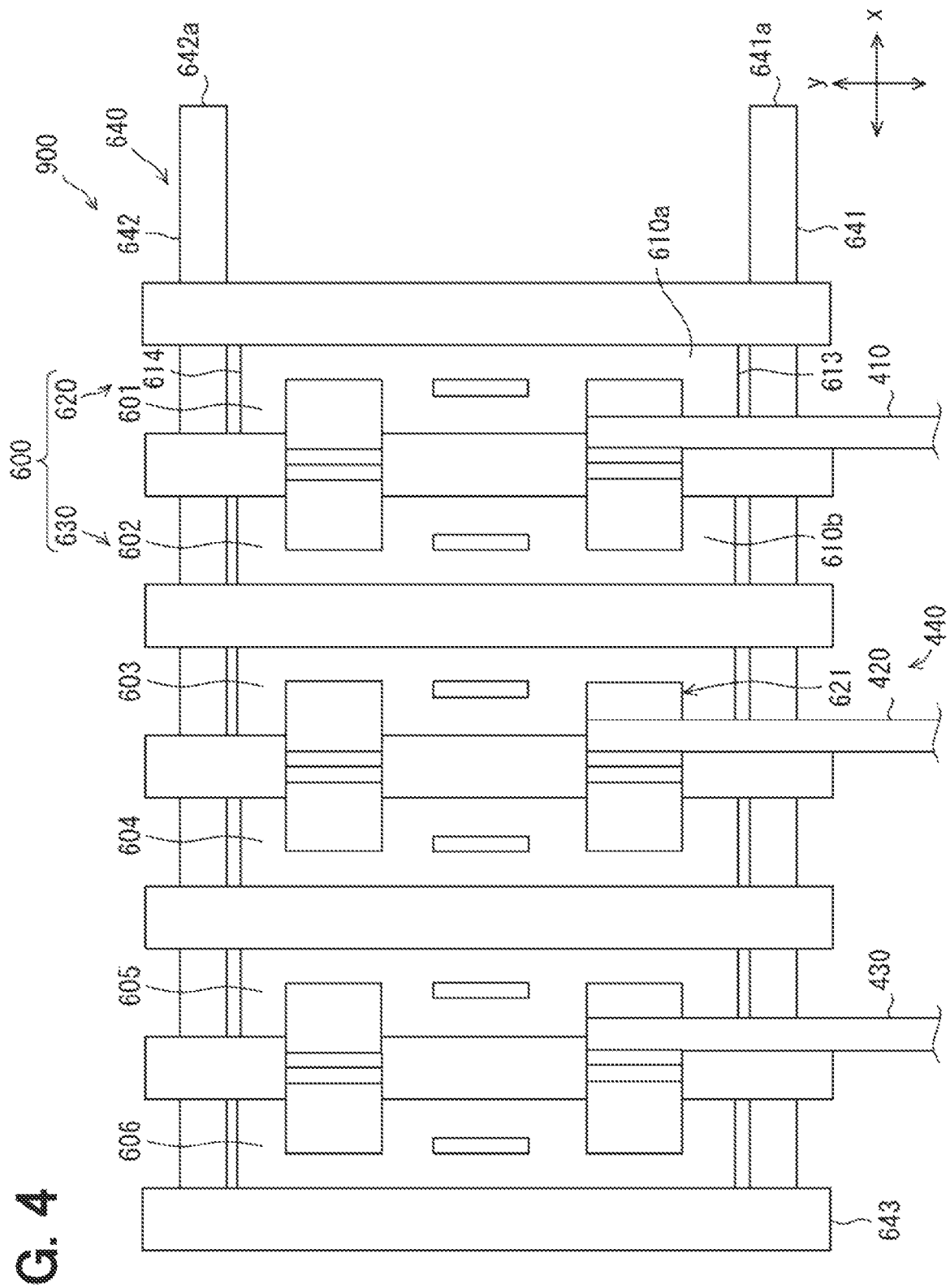
FIG. 4 is a plan view illustrating the power module connected to an output bus bar.

As illustrated in FIG. 4, the first output terminal 621 connects with the output bus bar 440 as well as the second output terminal 631. The output bus bar 440 is a flat, conductive metal plate that is thin in the x-direction. As illustrated in FIG. 7, a bus bar principal surface 440*a* of the output bus bar 440 faces an output surface 621*e* on the reverse side of a first end face 621*d* of the first output terminal 621 in the x-direction. The bus bar principal surface 440*a* and the output surface 621*e* are joined by laser welding, for example.

Consequently, the U-phase bus bar 410 is directly joined to the first output terminal 621 of the first U-phase module 601. The V-phase bus bar 420 is directly joined to the first output terminal 621 of the first V-phase module 603. The W-phase bus bar 430 is directly joined to the first output terminal 621 of the first W-phase module 605.

Main Terminals

Figure 8:
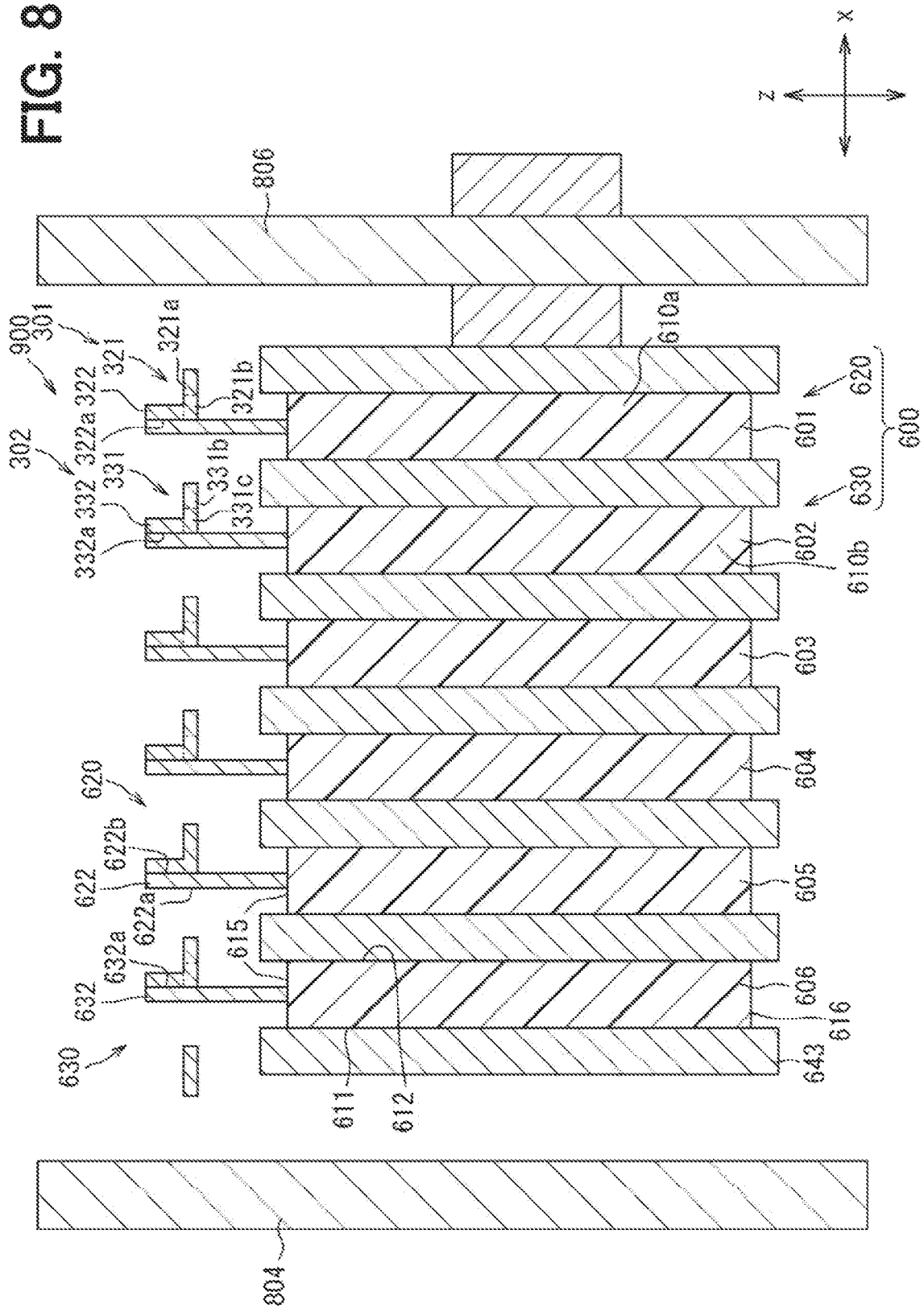
FIG. 8 is a sectional view of the power module taken along the line VIII-VIII of FIG. 2.

As illustrated in FIG. 8, the first main terminal 622 protrudes and extends from the first resin member 610a in the z-direction to separate from the top surface 615 of the first module 620. The second main terminal 632 protrudes and extends from the second resin member 610b in the z-direction to separate from the top surface 615 of the second module 630. The first main terminal 622 separately faces the second main terminal 632 in the x-direction.

Connection Terminals

Figure 9:
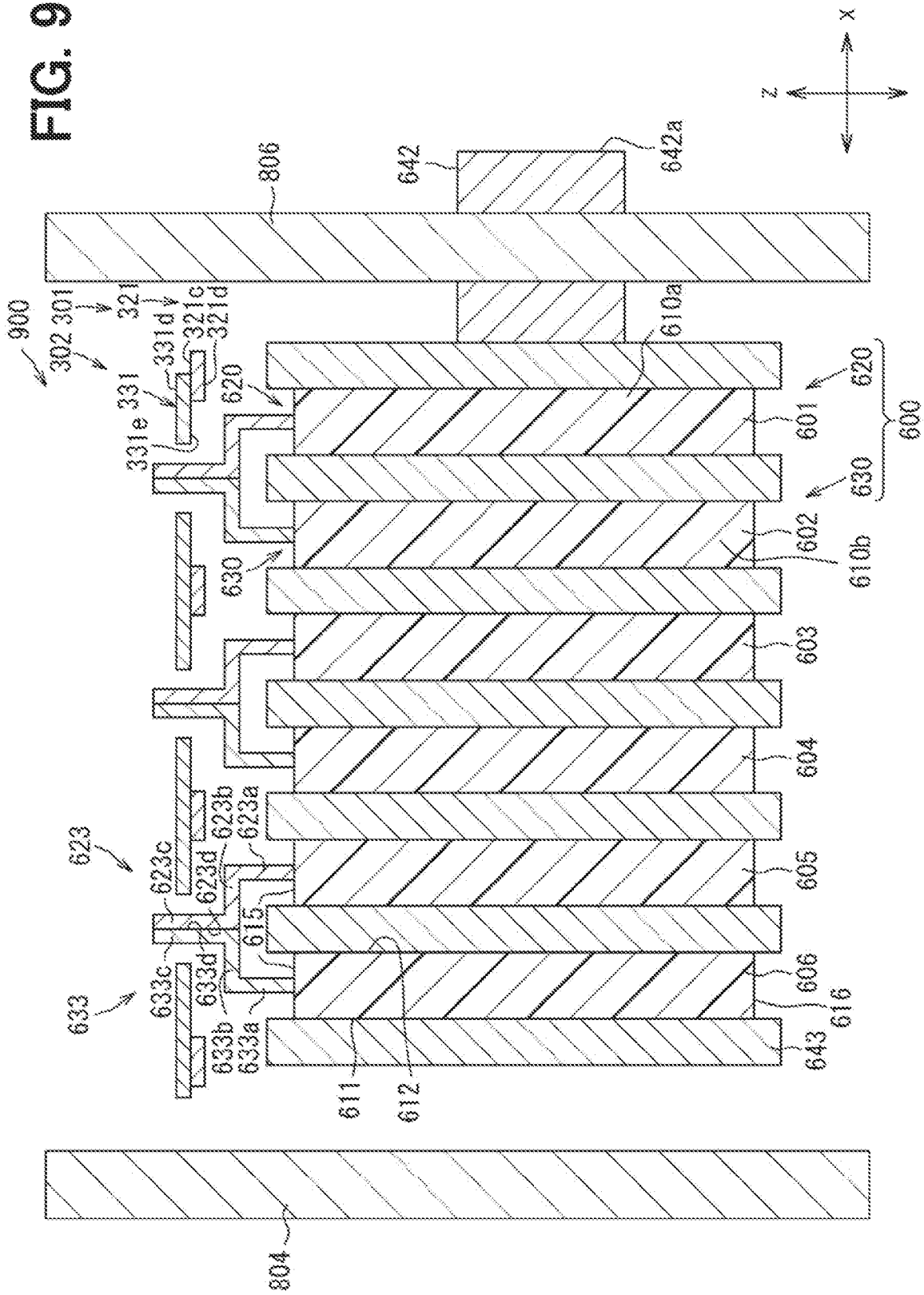
FIG. 9 is a sectional view of the power module taken along the line IX-IX of FIG. 2.

As illustrated in FIG. 9, the first connection terminal 623 includes a third base portion 623a, a third relay portion 623b, and a third extension portion 623c. The third base portion 623a protrudes and extends from the first resin member 610a in the z-direction to separate from the top surface 615. The third relay portion 623b extends from the end of the third base portion 623a in the x-direction to separate from the supply port 641a and the discharge port 642a. The third extension portion 623c extends from the end of the third relay portion 623b in the z-direction to separate from the top surface 615.

The second connection terminal 633 includes a fourth base portion 633a, a fourth relay portion 633b, and a fourth extension portion 633c. The fourth base portion 633a protrudes and extends from the second resin member 610b in the z-direction to separate from the top surface 615. The fourth relay portion 633b extends from the end of the fourth base portion 633a toward the supply port 641a and the discharge port 642a in the x-direction. The fourth extension portion 633c extends from the end of the fourth relay portion 633b in the z-direction to separate from the top surface 615.

The third base portion 623a separately faces the fourth base portion 633a in the x-direction. A third end face 623d of the third extension portion 623c separates from the supply port 641a and the discharge port 642a in the x-direction. The third end face 623d closely faces a fourth end face 633d of the fourth extension portion 633c toward the supply port 641a and the discharge port 642a in the x-direction. The third end face 623d and the fourth end face 633d are joined by laser welding, for example. Consequently, the first connection terminal 623 and the second connection terminal 633 are directly joined.

Capacitor Case and Bus Bars

The capacitor case 700 is made of an insulating resin material. As above, the capacitor case 700 stores the capacitor 310. As illustrated in FIG. 2, the first power supply bus bar 301 and the second power supply bus bar 302 are partially exposed from the capacitor case 700. The first power supply bus bar 301 is connected to one of two electrodes of the capacitor 310 and the second power supply bus bar 302 is connected to the other. The capacitors 310, the first power supply bus bar 301, and the second power supply bus bar 302 are resin-sealed on the capacitor case 700 with an encapsulating resin (unshown).

Storage in the Case

As above, the case 800 stores the capacitor case 700 and the power module 900. As shown in FIG. 2, the power module 900 and the capacitor case 700 are arranged in the y-direction in the storage space of the case 800. The capacitor case 700 is located closer to the second sidewall 805 than the power module 900.

The first power supply bus bar 301 and the second power supply bus bar 302 are exposed from the capacitor case 700 in the y-direction toward the fourth sidewall 807. As above, the output bus bar 440 is directly joined to the first output terminal 621. The output bus bar 440 extends toward the fourth sidewall 807 and is exposed from the case 800 in the y-direction. As above, the supply pipe 641 and the discharge pipe 642 extend in the x-direction. The supply pipe 641 and the discharge pipe 642 are exposed from the third sidewall 806.

First Power Supply Bus Bar

Figure 5:
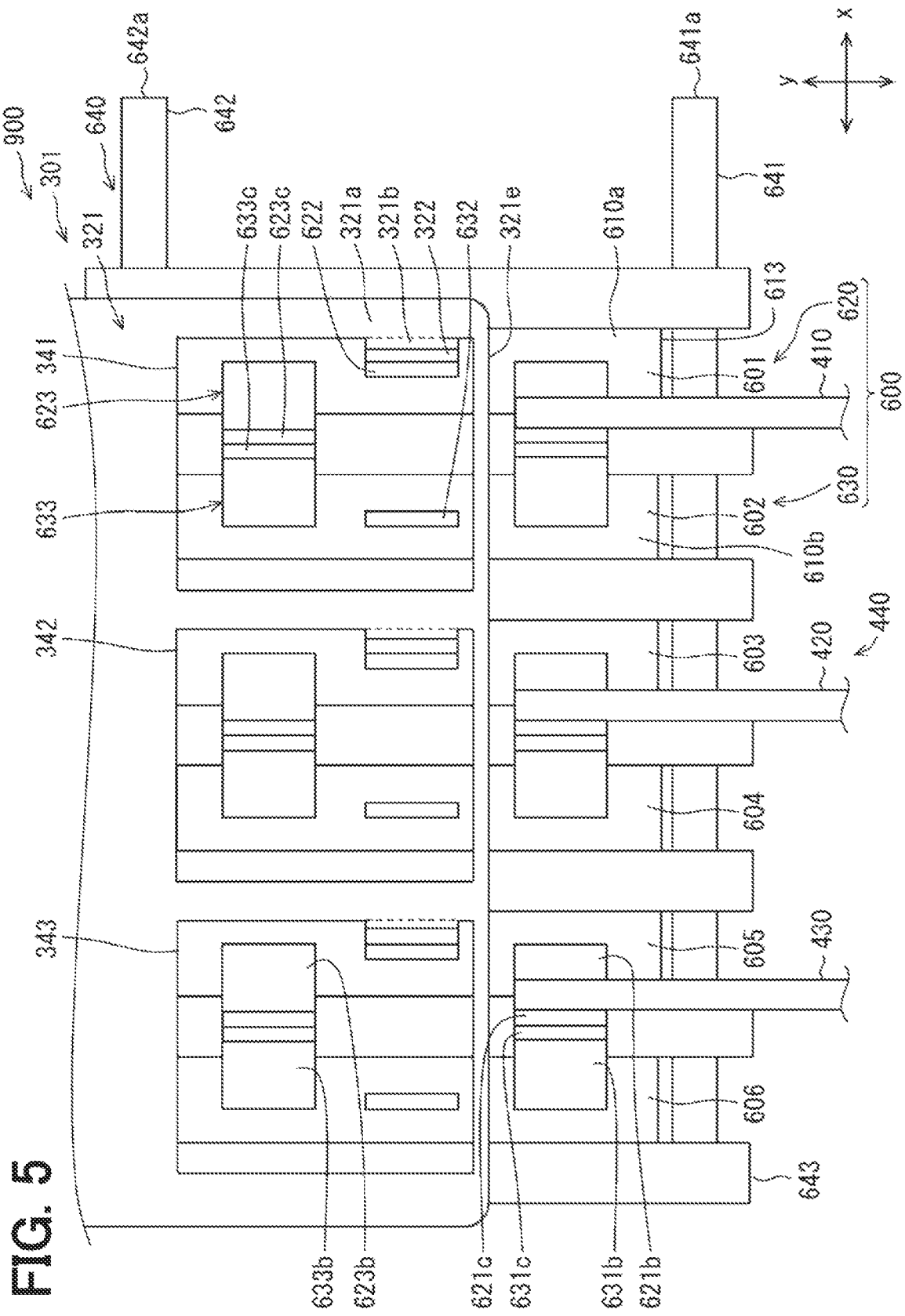
FIG. 5 is a plan view illustrating the power module connected to a first power supply bus bar.

The first power supply bus bar 301 is manufactured by pressing a conductive metal plate. As illustrated in FIGS. 5 and 8, the first power supply bus bar 301 includes a first main portion 321 and a first power supply portion 322. The first main portion 321 is thin in the z-direction. The first power supply portion 322 rises from the first main portion 321 in the z-direction and is thin in the x-direction. The description below explains the first main portion 321 in detail.

As illustrated in FIG. 9, the first main portion 321 is shaped to be thin and has a first outer surface 321c and a first inner surface 321d in the z-direction. The first main portion 321 is connected to one electrode of the capacitor 310. As illustrated in FIG. 2, the first main portion 321 extends from the capacitor case 700 toward the fourth sidewall 807 in the y-direction. As illustrated in FIGS. 2 and 5, a first edge portion 321e as an edge of the first main portion 321 toward the fourth sidewall 807 is located between the main terminal and the output terminal in the y-direction.

As illustrated in FIGS. 5 through 9, the first main portion 321 includes a first conductive portion 321a and a second conductive portion 321b. The first conductive portion 321a has three through-holes extending through the first outer surface 321c and the first inner surface 321d. The second conductive portion 321b extends to separate from the edge of each of the through-holes toward the third sidewall 806 in the x-direction. The first conductive portion 321a is connected to one electrode of the capacitor 310. The three through-holes are denoted as a first through-hole 341, a second through-hole 342, and a third through-hole 343. The three through-holes are arranged in the order of the first through-hole 341, the second through-hole 342, and the third through-hole 343 from the third sidewall 806 to the first sidewall 804. The broken line represents the boundary between the first conductive portion 321a and the second conductive portion 321b. The first through-hole 341, the second through-hole 342, and the third through-hole 343 are comparable to a first opening.

As illustrated in FIG. 8, the first power supply portion 322 is connected to the end of the second conductive portion 321b of the first main portion 321 toward the first sidewall 804 and extends in the z-direction to separate from the second conductive portion 321b. In FIG. 8, the broken line represents the boundary between the second conductive portion 321b and the first power supply portion 322.

Second Power Supply Bus Bar

Figure 6:
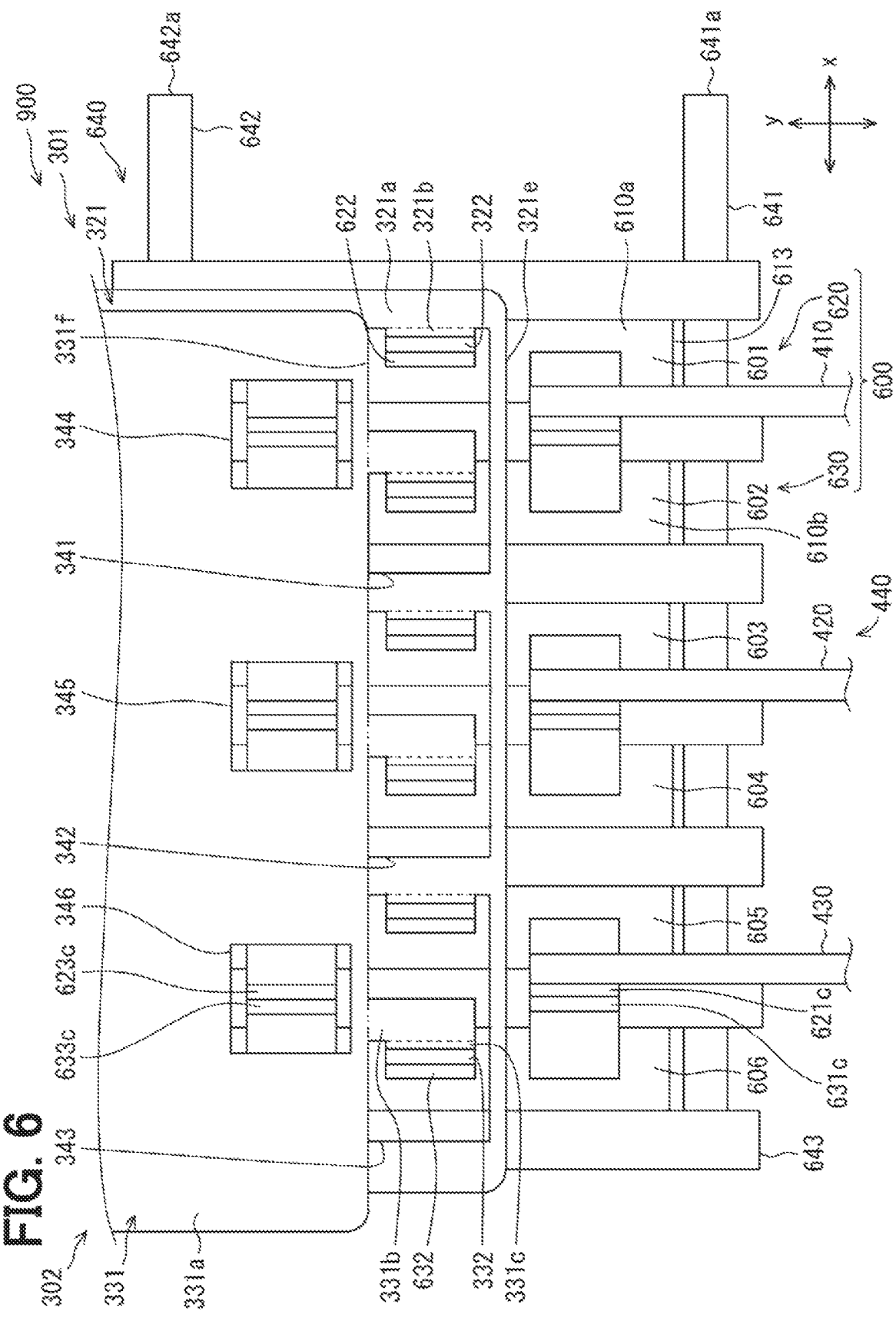
FIG. 6 is a plan view illustrating the power module connected to a second power supply bus bar.

The second power supply bus bar 302 is also manufactured by pressing a conductive metal plate. As illustrated in FIGS. 6 and 8, the second power supply bus bar 302 includes a second main portion 331 and a second power supply portion 332. The second main portion 331 is thin in the z-direction. The second power supply portion 332 rises from the second main portion 331 in the z-direction and is thin in the x-direction. The description below explains the second main portion 331 in detail.

As illustrated in FIG. 9, the second main portion 331 is shaped to be thin and has a second outer surface 331d and a second inner surface 331e arranged in the z-direction. The second main portion 331 is connected to the other electrode of the capacitor 310. As illustrated in FIG. 2, the second main portion 331 extends from the capacitor case 700 toward the fourth sidewall 807 in the y-direction. As illustrated in FIGS. 2 and 6, a second edge portion 331f as an edge of the second main portion 331 toward the fourth sidewall 807 is located between the connection terminal and the main terminal in the y-direction.

As illustrated in FIGS. 6 and 8, the second main portion 331 includes a third conductive portion 331a, a fourth conductive portion 331b, and a fifth conductive portion 331c. The third conductive portion 331a is connected to the other electrode of the capacitor 310. The third conductive portion 331a has three through-holes. The fourth conductive portion 331b extends to separate from a second edge portion 331f of the third conductive portion 331a in the y-direction. The fifth conductive portion 331c extends to separate from the first sidewall 804 of the fourth conductive portion 331b in the x-direction.

As illustrated in FIGS. 6 and 9, the three through-holes pierce through the second outer surface 331d and the second inner surface 331e of the third conductive portion 331a. The three through-holes are denoted as a fourth through-hole 344, a fifth through-hole 345, and a sixth through-hole 346. The three through-holes are arranged in the order of the fourth through-hole 344, the fifth through-hole 345, and the sixth through-hole 346 from the third sidewall 806 to the first sidewall 804. The fourth through-hole 344, the fifth through-hole 345, and the sixth through-hole 346 are comparable to a second opening.

As illustrated in FIG. 6, the three fourth conductive portions 331b extend to separate from the second edge portion 331f of the third conductive portion 331a in the y-direction. The fifth conductive portion 331c extends to separate from the end of the fourth conductive portion 331b toward the first sidewall 804 in the x-direction. In FIG. 6, the dash-dot-dot-dash line represents the boundary between the third conductive portion 331a and the fourth conductive portion 331b. The broken line represents the boundary between the fourth conductive portion 331b and the fifth conductive portion 331c. The positional relationship among the three fourth conductive portions 331b and terminals will be described in detail later.

As illustrated in FIG. 8, the second power supply portion 332 is connected to the end of the fifth conductive portion 331c toward the first sidewall 804 and extends in the z-direction to separate from the fifth conductive portion 331c. In FIG. 8, the broken line represents the boundary between the fifth conductive portion 331c and the second power supply portion 332.

Power Supply Bus Bars and Terminals

As illustrated in FIGS. 2 and 9, the first power supply bus bar 301 is provided toward the opening of the case 800 so that the first inner surface 321d faces the top surface 615 and the discharge pipe 642 of the switch module 600 in the z-direction.

As illustrated in FIGS. 5 through 9, the third extension portion 623c of the first connection terminal 623, the fourth extension portion 633c of the second connection terminal 633, the first main terminal 622, and the second main terminal 632 pass through the three through-holes formed in the first conductive portion 321a.

Specifically, the first through-hole 341 exposes the third extension portion 623c of the first connection terminal 623 and the first main terminal 622 of the first U-phase module 601; and the fourth extension portion 633c of the second connection terminal 633 and the second main terminal 632 of the second U-phase module 602. The third extension portion 623c and the fourth extension portion 633c are directly joined. The first main terminal 622 of the first U-phase module 601 separately faces the second main terminal 632 of the second U-phase module 602 in the x-direction.

The second through-hole 342 exposes the third extension portion 623c of the first connection terminal 623 and the first main terminal 622 of the first V-phase module 603; and the fourth extension portion 633c of the second connection terminal 633 and the second main terminal 632 of the second V-phase module 604. The third extension portion 623c and the fourth extension portion 633c are directly joined. The first main terminal 622 of the first V-phase module 603 separately faces the second main terminal 632 of the second V-phase module 604 in the x-direction.

The third through-hole 343 exposes the third extension portion 623c of the first connection terminal 623 and the first main terminal 622 of the first W-phase module 605; and the fourth extension portion 633c of the second connection terminal 633 and the second main terminal 632 of the second W-phase module 606. The third extension portion 623c and the fourth extension portion 633c are directly joined. The first main terminal 622 of the first W-phase module 605 separately faces the second main terminal 632 of the second W-phase module 606 in the x-direction.

As illustrated in FIGS. 2 and 9, the second power supply bus bar 302 is provided toward the opening of the case 800 so that the second inner surface 331e faces the first outer surface 321c of the first power supply bus bar 301 in the z-direction. An insulating plate (unshown) is provided between the first outer surface 321c and the second inner surface 331e. The insulating plate ensures the insulation properties of the first power supply bus bar 301 and the second power supply bus bar 302. As illustrated in FIG. 2, the second edge portion 331f of the second power supply bus bar 302 is located closer to the second sidewall 805 than the first edge portion 321e of the first power supply bus bar 301.

As illustrated in FIGS. 6 and 9, the three through-holes formed in the third conductive portion 331a are communicated with the three through-holes formed in the first conductive portion 321a in the z-direction. Specifically, the fourth through-hole 344 is communicated with the first through-hole 341 in the z-direction. The fifth through-hole 345 is communicated with the second through-hole 342 in the z-direction. The sixth through-hole 346 is communicated with the third through-hole 343 in the z-direction.

As above, the three fourth conductive portions 331b extend to separate from the second edge portion 331f of the third conductive portion 331a in the y-direction. As illustrated in FIG. 6, the ends of the three fourth conductive portions 331b toward the fourth sidewall 807 are located closer to the second sidewall 805 than the first edge portion 321e of the first main portion 321. As illustrated in FIG. 8, the three fourth conductive portions 331b are located between a sixth end face 622a of the first main terminal 622 toward the first sidewall 804 and a seventh end face 632a of the second main terminal 632 toward the third sidewall 806 in the x-direction.

More specifically, one of the fourth conductive portions 331b is located between the sixth end face 622a of the first main terminal 622 of the first U-phase module 601 and the seventh end face 632a of the second main terminal 632 of the second U-phase module 602.

One of the fourth conductive portions 331b is located between the sixth end face 622a of the first main terminal 622 of the first V-phase module 603 and the seventh end face 632a of the second main terminal 632 of the second V-phase module 604.

One of the fourth conductive portions 331b is located between the sixth end face 622a of the first main terminal 622 of the first W-phase module 605 and the seventh end face 632a of the second main terminal 632 of the second W-phase module 606.

Connection Between the First Power Supply Bus Bar and the Main Terminal

As above, the first main terminal 622 extends in the z-direction. The first power supply portion 322 also extends in the z-direction. As illustrated in FIG. 8, the first main terminal 622 faces the first power supply portion 322 in the x-direction. A fifth end face 622b of the first main terminal 622 toward the third sidewall 806 closely faces an eighth end face 322a of the first power supply portion 322 toward the first sidewall 804 in the x-direction. The fifth end face 622b and the eighth end face 322a are joined by laser welding, for example. Consequently, the first main terminal 622 and the first power supply portion 322 are directly joined.

Connection Between the Second Power Supply Bus Bar and the Main Terminal

As above, the second main terminal 632 extends in the z-direction. The second power supply portion 332 also extends in the z-direction. As shown in FIG. 8, the second main terminal 632 faces the second power supply portion 332 in the x-direction. The seventh end face 632a of the second main terminal 632 closely faces a ninth end face 332a of the second power supply portion 332 toward the first sidewall 804 in the x-direction. The seventh end face 632a and the ninth end face 332a are joined by laser welding, for example. Consequently, the second main terminal 632 and the second power supply portion 332 are directly joined.

Connection Between the Output Bus Bar and the Output Terminal

As above, the bus bar principal surface 440a of the output bus bar 440 faces the output surface 621e on the reverse side of the first end face 621d of the first output terminal 621 in the x-direction. The bus bar principal surface 440a and the output surface 621e are joined by laser welding, for example. Consequently, the output bus bar 440 is directly connected to the first output terminal 621.

Operation and Effect

As above, the first end face 621d of the second output terminal 631 closely faces the second end face 631d of the second extension portion 631c in the x-direction. The first end face 621d and the second end face 631d are joined by laser welding, for example. The first output terminal 621 and the second output terminal 631 are directly joined. Consequently, the first module 620 and the second module 630 are directly joined.

The configuration enables to easily decrease inductance components between the first module 620 and the second module 630 compared to a configuration where the first output terminal 621 and the second output terminal 631 are separated in the x-direction and are indirectly joined via an inclusion such as a conductive member.

As above, a closed loop is formed among the capacitor 310, the first module 620, and the second module 630. The closed loop may cause an LC resonance if the closed loop contains an inductance component or a capacitance component.

However, as above, the first output terminal 621 of the first module 620 is directly joined to the second output terminal 631 of the second module 630. Inductance components between the first module 620 and the second module 630 tend to decrease. The closed loop tends to reduce an LC resonance. This makes it possible to easily inhibit a voltage exceeding the withstand voltage from being applied to multiple switches provided for the first module 620 and the second module 630.

As above, the third conductive portion 331a of the second power supply bus bar 302 is connected to the other electrode of the capacitor 310. The second power supply portion 332 of the second power supply bus bar 302 is connected to the second main terminal 632. The second power supply portion 332 is connected to the third conductive portion 331a via the fourth conductive portion 331b and the fifth conductive portion 331c. Therefore, the third conductive portion 331a provides an energizing path between the capacitor 310 and the second main terminal 632.

As illustrated in FIGS. 2 and 6, the second main terminal 632 is located closer to the fourth sidewall 807 than the capacitor 310 in the y-direction. There is a through-hole letting the first connection terminal 623 and the second connection terminal 633 pass through in a region between the capacitor 310 in the third conductive portion 331a and the second main terminal 632. The through-hole formed in the third conductive portion 331a is communicated with the through-hole formed in the first conductive portion 321a in the z-direction.

The first connection terminal 623 and the second connection terminal 633 are joined with the third end face 623d and the fourth end face 633d, respectively, and pass through the above-mentioned communicating hole. The configuration enables to easily shorten the distance between one end and the other end of the communicating hole in the x-direction compared to a configuration where the first connection terminal 623 and the second connection terminal 633 are separated in the x-direction and pass through the communicating hole, for example.

The configuration enables to inhibit the shortest energizing path between the second main terminal 632 and the capacitor 310 from being extended due to the communicating hole compared to a configuration that necessitates a long distance between one end and the other end of the communicating hole in the x-direction. Inductance components between the second module 630 and the capacitor 310 tend to decrease.

This makes it easier to reduce an LC resonance occurring on the closed loop formed among the capacitor 310, the first module 620, and the second module 630. The configuration enables to easily inhibit damage to the multiple switches provided for the first module 620 and the second module 630.

There has been described the preferred embodiment of the present disclosure. However, the disclosure is not limited to the above-mentioned embodiment but may be otherwise variously modified within the spirit and scope of the disclosure.

(First Modification)

According to the present embodiment, as illustrated in FIGS. 2 and 5, the first connection terminal 623, the second connection terminal 633, the first main terminal 622, and the second main terminal 632 pass through the through-hole formed in the first conductive portion 321a.

Figure 10:
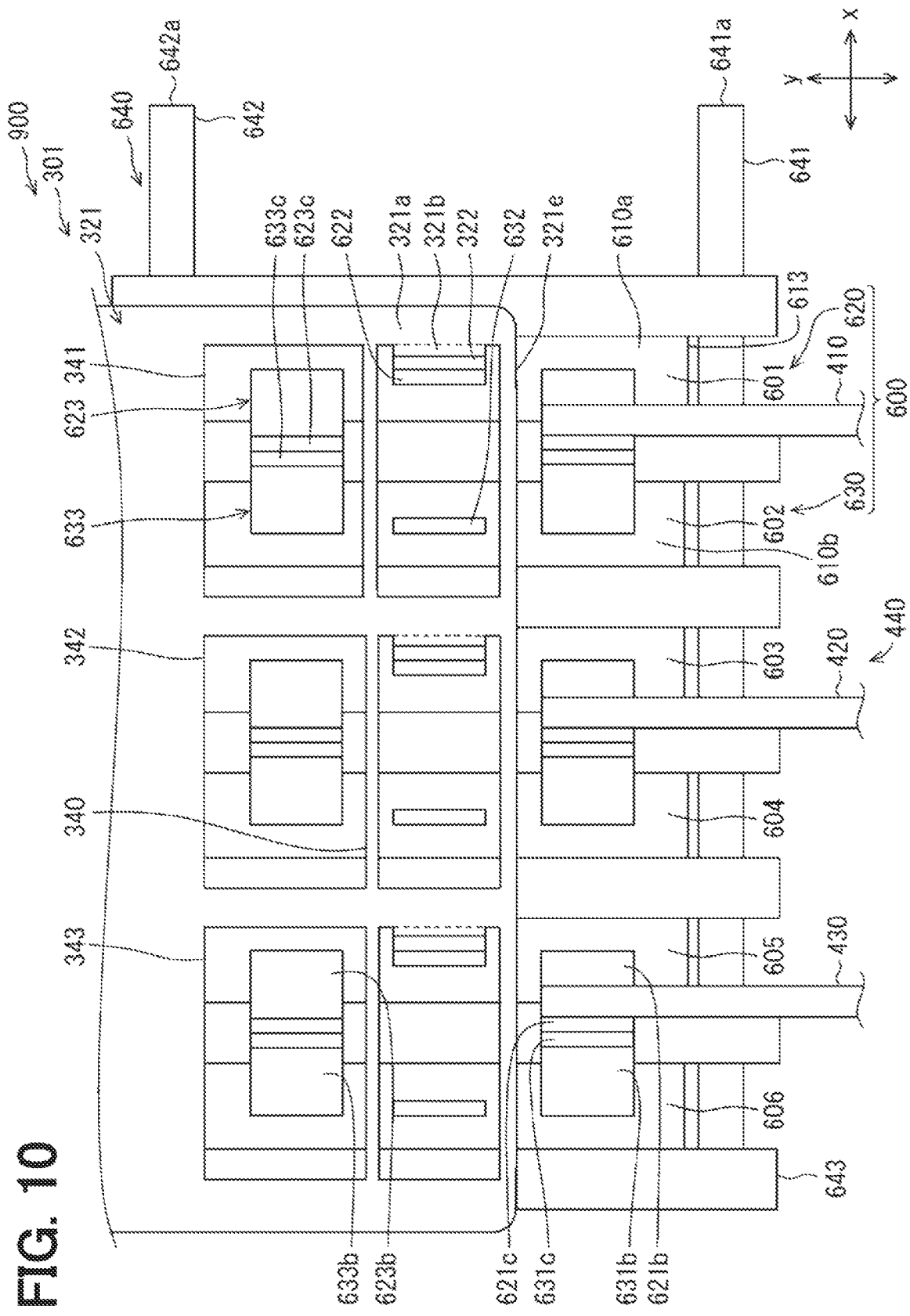
FIG. 10 is a plan view illustrating a modification of through-holes.

However, as illustrated in FIG. 10, a partitioning portion 340 may be provided to partition the through-hole formed in the first conductive portion 321a in the y-direction. Only the connection terminal may pass through the through-hole toward the capacitor. Only the main terminal may pass through the through-hole toward the fourth sidewall 807.

(Second Modification)

According to the present embodiment, the first output terminal 621 includes the first base portion 621a, the first relay portion 621b, and the first extension portion 621c. The second output terminal 631 includes the second base portion 631a, the second relay portion 631b, and the second extension portion 631c.

The first end face 621d of the first extension portion 621c closely faces the second end face 631d of the first extension portion 621c in the x-direction. The first end face 621d and the second end face 631d are joined by laser welding, for example. Consequently, the first output terminal 621 and the second output terminal 631 are directly joined.

Figure 11:
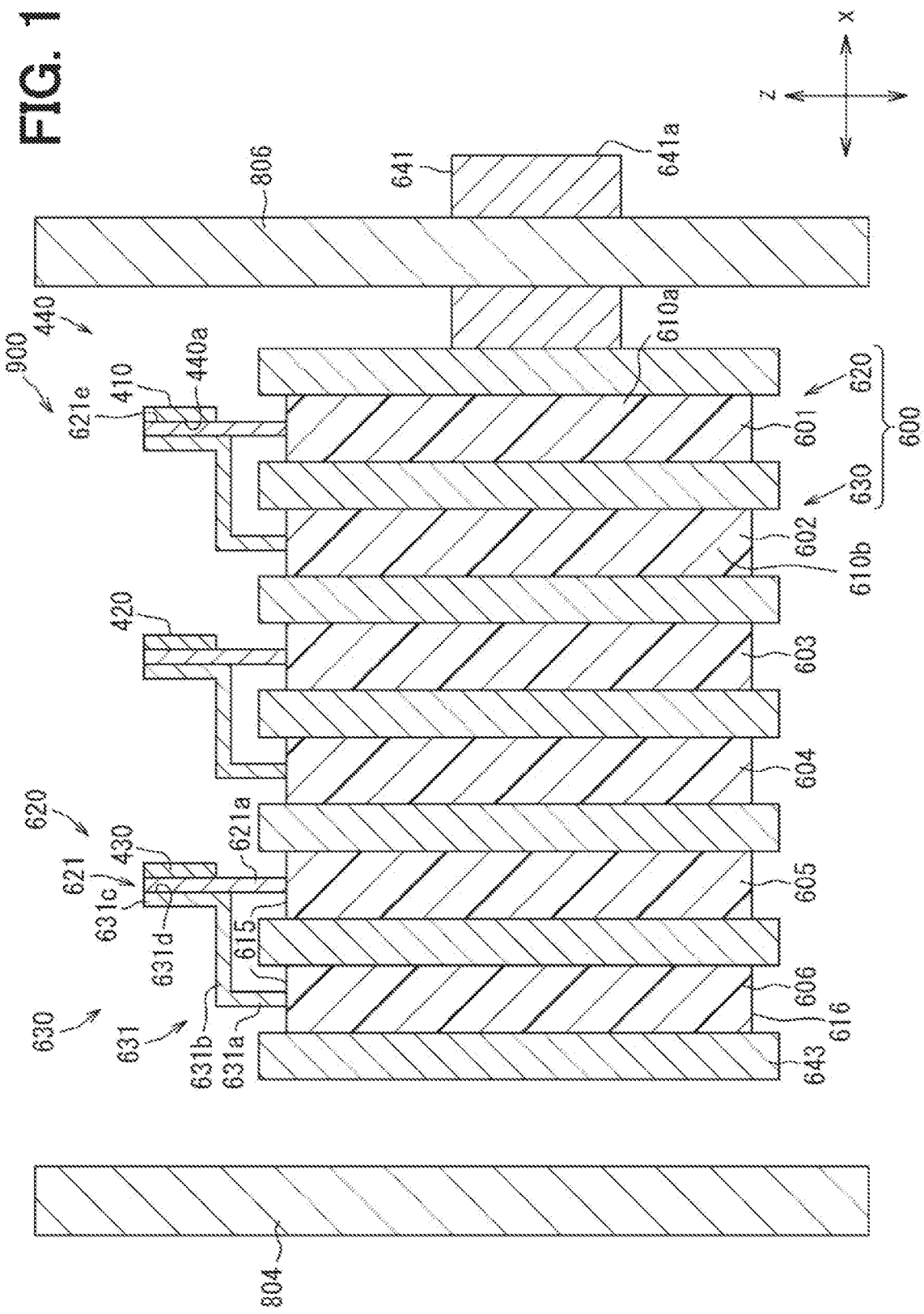
FIG. 11 is a sectional view illustrating a modification of the power module.

However, as illustrated in FIG. 11, the first output terminal 621 may include only the first base portion 621a extending in the z-direction. In this case, the second relay portion 631b of the second output terminal 631 extends from the second base portion 631a to the first base portion 621a. The second extension portion 631c extends from the end of the second relay portion 631b in the z-direction to separate from the top surface 615 and may closely face the first base portion 621a in the x-direction. The second extension portion 631c and the first base portion 621a may be directly joined. Though unshown, the first output terminal 621 may include the first base portion 621a, the first relay portion 621b, and the first extension portion 621c. The second output terminal 631 may include only the second base portion 631a.

(Third Modification)

According to the present embodiment, as illustrated in FIG. 9, the first connection terminal 623 and the second connection terminal 633 pass through each of the three through-holes formed in the third conductive portion 331a.

The first connection terminal 623 includes the third base portion 623a, the third relay portion 623b, and the third extension portion 623c. The second connection terminal 633 includes the fourth base portion 633a, the fourth relay portion 633b, and the fourth extension portion 633c.

The third end face 623d of the third extension portion 623c closely faces the fourth end face 633d of the fourth extension portion 633c in the x-direction. The third end face 623d and the fourth end face 633d are joined by laser welding, for example. Consequently, the first connection terminal 623 and the second connection terminal 633 are directly joined.

Figure 12:
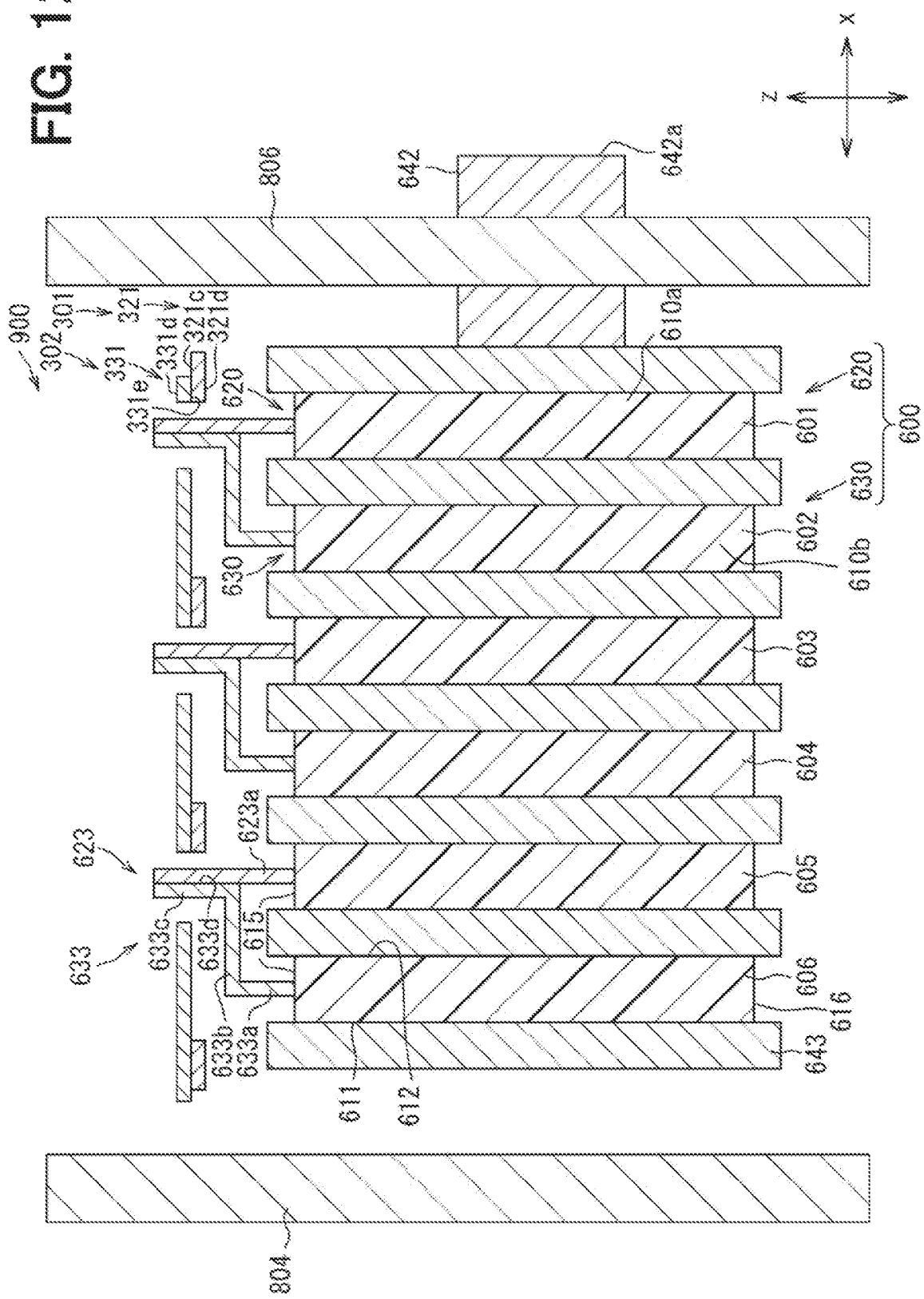
FIG. 12 is a sectional view illustrating a modification of the power module.

However, as illustrated in FIG. 12, the first connection terminal 623 may include only the third base portion 623a extending in the z-direction. In this case, the fourth relay portion 633b of the second connection terminal 633 extends from the fourth base portion 633a to the third base portion 623a. The fourth extension portion 633c extends from the end of the fourth relay portion 633b in the z-direction to separate from the top surface 615 and may closely face the third base portion 623a in the x-direction. The fourth extension portion 633c and the third base portion 623a may be directly joined. Though unshown, the first connection terminal 623 may include the third base portion 623a, the third relay portion 623b, and the third extension portion 623c. The second connection terminal 633 may include only the fourth base portion 633a

OTHER MODIFICATIONS

The present embodiment has provided the example in which the power conversion apparatus 300 includes the inverter 500. However, the power conversion apparatus 300 may include a converter in addition to the inverter 500.

The present embodiment has provided the example in which the power conversion apparatus 300 is included in the in-vehicle system 100 for electric vehicles. However, the power conversion apparatus 300 is not limited thereto. For example, the power conversion apparatus 300 may be included in a hybrid system equipped with a motor and an internal combustion engine.

The present embodiment has provided the example in which one motor 400 is connected to the power conversion apparatus 300. However, multiple motors 400 may be connected to the power conversion apparatus 300. In this case, the power conversion apparatus 300 includes multiple three-phase switch modules to configure an inverter.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A power conversion apparatus comprising:
a first module including
a plurality of first switches each including a first electrode and a second electrode,
a first internal bus bar mutually connecting the first electrodes with each other,
a second internal bus bar mutually connecting the second electrodes with each other, and
a first resin member that encapsulates the first switches, the first internal bus bar, and the second internal bus bar;
a second module including
a plurality of second switches each including a third electrode and a fourth electrode,
a third internal bus bar mutually connecting the third electrodes with each other,
a fourth internal bus bar mutually connecting the fourth electrodes with each other, and
a second resin member that encapsulates the second switches, the third internal bus bar, and the fourth internal bus bar, wherein the second module is arranged alongside with the first module;
a first power supply bus bar connected to a part of the first internal bus bar, which is exposed from the first resin member;
a second power supply bus bar connected to a part of the fourth internal bus bar, which is exposed from the second resin member; and
a capacitor including electrodes connected to the first power supply bus bar and the second power supply bus bar, respectively, wherein
the first power supply bus bar includes
a first opening extending through the first power supply bus bar in an orthogonal direction, which is orthogonal to an arrangement direction along which the first module and the second module are arranged alongside, and
a first power supply portion connected to the part of the first internal bus bar exposed from the first resin member,
the second power supply bus bar includes a second opening extending through the second power supply bus bar in the orthogonal direction and a second power supply portion connected to the part of the fourth internal bus bar exposed from the second resin member, the second internal bus bar is partially exposed from the first resin member such that the second internal bus bar extends in the orthogonal direction, the third internal bus bar is partially exposed from the second resin member such that the third internal bus bar extends in the orthogonal direction, at least one of the second internal bus bar or the third internal bus bar extends toward the other, such that the second internal bus bar and the third internal bus bar are directly joined with each other, a part of the second internal bus bar and a part of the third internal bus bar are located closer to the capacitor than the first power supply portion and the second power supply portion in a horizontal direction, which is orthogonal to the arrangement direction and the orthogonal direction, and the part of the second internal bus bar and the part of the third internal bus bar pass through the first opening and the second opening.

2. The power conversion apparatus according to claim 1, wherein the first opening and the second opening overlap one another in the orthogonal direction, and the part of the second internal bus bar and the part of the third internal bus bar extend through first opening and the second opening and is exposed through the first opening and the second opening.

3. The power conversion apparatus according to claim 2, wherein each of the part of the second internal bus bar and the part of the third internal bus bar is in a plate shape extending in the orthogonal direction, and a plane surface of the second internal bus bar is directly faced to a plane surface of the third internal bus bar.

* * * * *